United States Patent
Ong et al.

(10) Patent No.: US 6,872,801 B2
(45) Date of Patent: Mar. 29, 2005

(54) POLYTHIOPHENES AND DEVICES THEREOF

(75) Inventors: Beng S. Ong, Mississauga (CA); Ping Liu, Mississauga (CA); Yiliang Wu, Mississauga (CA); Yu Qi, Mississauga (CA)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 10/042,360

(22) Filed: Jan. 11, 2002

(65) Prior Publication Data

US 2003/0166829 A1 Sep. 4, 2003

(51) Int. Cl.⁷ .............................................. C08G 75/00
(52) U.S. Cl. ...................................... 528/373; 528/377
(58) Field of Search ................................. 528/373, 377

(56) References Cited

U.S. PATENT DOCUMENTS

| | | | | |
|---|---|---|---|---|
| 5,069,823 A | * | 12/1991 | Sato et al. ................... | 252/500 |
| 5,347,144 A | * | 9/1994 | Garnier et al. ................ | 257/40 |
| 5,619,357 A | | 4/1997 | Angelopoulos et al. ...... | 349/110 |
| 5,777,070 A | | 7/1998 | Inbasekaran et al. ........ | 528/394 |
| 5,969,376 A | | 10/1999 | Bao ............................. | 257/40 |
| 6,107,117 A | | 8/2000 | Bao et al. .................... | 438/99 |
| 6,150,191 A | | 11/2000 | Bao ............................. | 438/99 |
| 6,320,200 B1 | * | 11/2001 | Reed et al. ................... | 257/40 |

FOREIGN PATENT DOCUMENTS

| | | |
|---|---|---|
| EP | 0 203 438 A1 | 12/1986 |
| EP | 0 852 403 A1 | 7/1998 |
| EP | 1 279 689 A2 | 1/2003 |

OTHER PUBLICATIONS

McCullough et al "The tuning of conjugation by recipe: the synthesis and properties of random head to tail poly(3–alkylthiophene) copolymers" 1995, Chem Abstract 122: 161603.*

D.J. Gundlach et al., "Pentacene organic thin film transistors—molecular ordering and mobility", IEEE Electron Device Lett., vol. 18, p. 87 (1997).

F. Garnier et al., "Molecular engineering of organic semiconductors: Design of self–assembly properties in conjugated thiophene oligomers", Amer. Chem. Soc., vol. 115, p. 8716 (1993).

Z. Bao et al., "Soluble and processable regioregular poly(3–hexylthiophene) for field–effect thin film transistor application with high mobility", Appl. Phys. Lett. vol. 69, p 4108 (1996).

Effenberger et al., "Anthryloligothienylporphyrins: Energy Transfer and Light–Harvesting Systems", Chem. Eur. J., vol. 4, no. 2, 1998, pp. 260–269.

* cited by examiner

Primary Examiner—Duc Truong
(74) Attorney, Agent, or Firm—Eugene O. Palazzo; Fay, Sharpe, Fagan, Minnich & McKee LLP

(57) ABSTRACT

A polythiophene wherein the monomer segments thereof contain:

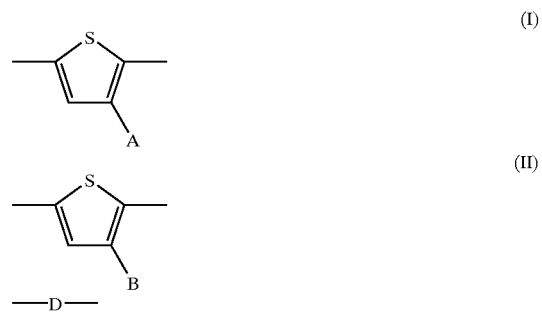

Figure 1:
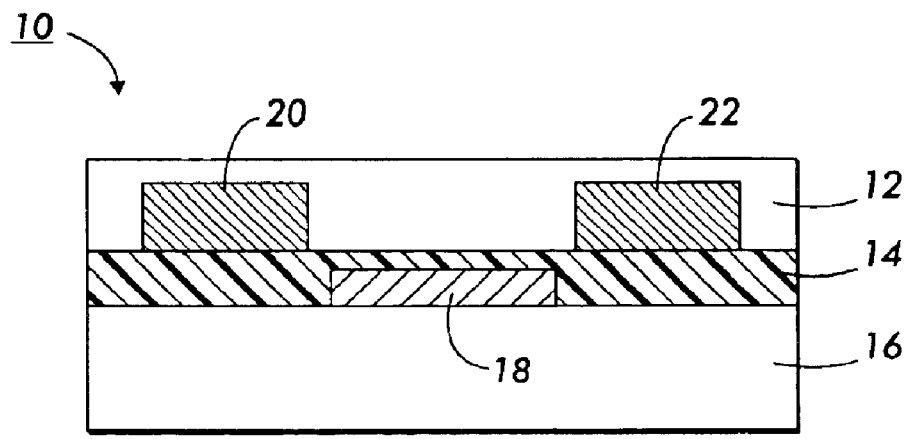

wherein A is a side chain; B is hydrogen or a side chain; and D is a divalent segment, and wherein the number of A-substituted thienylene units (I) in the monomer segments is from about 1 to about 10, the number of B-substituted thienylene units (II) is from 0 to about 5, and the number of divalent segments D is 0 or 1.

25 Claims, 2 Drawing Sheets

POLYTHIOPHENES AND DEVICES THEREOF

COPENDING APPLICATIONS

Illustrated in copending applications U.S. Ser. No. 10/042,358, U.S. Ser. No. 10,042,342, U.S. Ser. No. 10,042,356, now U.S. Pat. No. 6,621,099, U.S. Ser. No. 10/042,357, U.S. Ser. No. 10/042,360, the disclosures of which are totally incorporated herein by reference, and filed concurrently herewith, all titled "Polythiophenes and Devices Thereof" and all filed Jan. 11, 2002, are polythiophenes and devices thereof. The appropriate components, processes thereof and uses thereof illustrated in these copending applications may be selected for the present invention in embodiments thereof.

BACKGROUND

The present invention is generally directed to polythiophenes and uses thereof. More specifically, the present invention in embodiments is directed to a class of polythiophenes comprised of monomer segments containing at least two different types of 2,5-thienylene units and an optional divalent moiety, and which polythiophenes are capable of molecular self-organization, providing ordered microstructures in thin films that can be ideal for microelectronic device applications. An example of such polythiophenes include certain thienylene moieties with long side chains, which are arranged in a regioregular manner on the polymer chain, and which can assist to induce and to facilitate molecular organization of the polythiophenes.

Semiconductive polymers like certain polythiophenes, which are useful as active semiconductor materials in thin film transistors (TFTs), have been reported. A number of these polymers have some solubility in organic solvents and are thus able to be fabricated as semiconductor channel layers in TFTs by solution processes, such as spin coating, solution casting, dip coating, screen printing, stamp printing, jet printing and the like. Their ability to be fabricated via common solution processes would render their manufacturing simpler and cost effective as compared to the costly conventional photolithographic processes typical of silicon-based devices such as hydrogenated amorphous silicon TFTs. Moreover, desired are transistors fabricated with polymer materials, such as polythiophenes, referred to as polymer TFTs, with excellent mechanical durability and structural flexibility, which may be highly desirable for fabricating flexible TFTs on plastic substrates. Flexible TFTs would enable the design of electronic devices which usually require structural flexibility and mechanical durability characteristics. The use of plastic substrates together with organic or polymer transistor components can transform the traditionally rigid silicon TFT into a mechanically more durable and structurally flexible polymer TFT design. The latter is of particular value to large area devices such as large area image sensors, electronic paper and other display media. Also, the selection of polymer TFTs for integrated circuit logic elements for low end microelectronics, such as smart cards, radio frequency identification (RFID) tags, and memory/storage devices, may also greatly enhance their mechanical durability, and thus their useful life span. Nonetheless, many of the semiconductor polythiophenes are not, it is believed, stable when exposed to air as they become oxidatively doped by ambient oxygen, resulting in increased conductivity. The result is larger off-current and thus lower current on/off ratio for the devices fabricated from these materials. Accordingly, with many of these materials, rigorous precautions have to be undertaken during materials processing and device fabrication to exclude environmental oxygen to avoid or minimize oxidative doping. These precautionary measures add to the cost of manufacturing therefore offsetting the appeal of certain polymer TFTs as an economical alternative to amorphous silicon technology, particularly for large area devices. These and other disadvantages are avoided or minimized in embodiments of the present invention.

REFERENCES

A number of organic semiconductor materials has been described for use in field-effect TFTs, which materials include organic small molecules such as pentacene, see for example D. J. Gundlach et al., "Pentacene organic thin film transistors—molecular ordering and mobility", *IEEE Electron Device Lett.*, Vol. 18, p. 87 (1997), to oligomers such as sexithiophenes or their variants, see for example reference F. Garnier et al., "Molecular engineering of organic semiconductors: Design of self-assembly properties in conjugated thiophene oligomers", *Amer. Chem. Soc.*, Vol. 115, p. 8716 (1993), and certain polythiophenes, such as poly(3-alkylthiophene), see for example reference Z. Bao et al., "Soluble and processable regioregular poly(3-hexylthiophene) for field-effect thin film transistor application with high mobility", *Appl. Phys. Lett.* Vol. 69, p4108 (1996). Although organic material based TFTs generally provide lower performance characteristics than their conventional silicon counterparts, such as silicon crystal or polysilicon TFTs, they are nonetheless sufficiently useful for applications in areas where high mobility is not required. These include large area devices, such as image sensors, active matrix liquid crystal displays and low end microelectronics such as smart cards and RFID tags. TFTs fabricated from organic or polymer materials may be functionally and structurally more desirable than conventional silicon technology in the aforementioned areas in that they may offer mechanical durability, structural flexibility, and the potential of being able to be incorporated directly onto the active media of the devices, thus enhancing device compactness for transportability. However, most small molecule or oligomer-based devices rely on difficult vacuum deposition techniques for fabrication. Vacuum deposition is selected primarily because the small molecular materials are either insoluble or their solution processing by spin coating, solution casting, or stamp printing do not generally provide uniform thin films. In addition, vacuum deposition may also involve the difficulty of achieving consistent thin film quality for large area format. Polymer TFTs, such as those fabricated from regioregular polythiophenes of, for example, regioregular poly(3-alkylthiophene-2,5-diyl) by solution processes, while offering reasonably good mobility, suffer from their propensity towards oxidative doping in air. For practical low cost TFT design, it is therefore of value to have a semiconductor material that is both stable and solution processable, and where its performance is not adversely affected by ambient oxygen, for example, regioregular polythiophenes such as poly(3-alkylthiophene-2,5-diyl) are very sensitive to air. The TFTs fabricated from these materials in ambient conditions generally exhibit very large off-current, very low current on/off ratios, and their performance characteristics degrade rapidly.

References that may be of interest include U.S. Pat. Nos. 6,150,191; 6,107,117; 5,969,376; 5,619,357, and 5,777,070.

FIGURES

Illustrated in FIGS. 1 to 4 are various representative embodiments wherein certain polythiophenes are, for example, selected as the channel materials in thin film transistor configurations.

SUMMARY

It is a feature of the present invention to provide semiconductor polymers, such as polythiophenes, which are useful for microelectronic device applications, such as thin film transistor devices.

It is another feature of the present invention to provide polythiophenes which are soluble in common organic coating solvents such as, for example, methylene chloride, tetrahydrofuran, toluene, xylene, mesitylene, chlorobenzene, and the like, and thus can be fabricated by solution processes such as spin coating, screen printing, stamp printing, dip coating, solution casting, jet printing and the like.

Another feature of the present invention resides in providing electronic devices, such as TFTs with a polythiophene channel layer, and which layer has a conductivity of from $10^{-6}$ to about $10^{-9}$ S/cm (Siemens/centimeter).

A further feature of the present invention is to provide polythiophenes which are accessible synthetically, and which polythiophenes possess enhanced resistance to oxidative doping by ambient oxygen.

Also, in yet another feature of the present invention there are provided polythiophenes and devices thereof, and which devices exhibit enhanced resistance to the adverse effects of oxygen, that is, these devices exhibit relatively high current on/off ratios, and their performance does not usually degrade as rapidly as those fabricated from regioregular polythiophenes such as regioregular poly(3-alkylthiophene-3,5-diyl).

Additionally, in a further feature of the present invention there is provided a class of polythiophenes with unique structural features which are conducive to molecular self-alignment under appropriate processing conditions and which structural features also enhance the stability of device performance. Proper molecular alignment can result in higher molecular structural order in thin films, which can be important to efficient charge carrier transport, and thus higher electrical performance.

Aspects of the present invention relate to a polythiophene

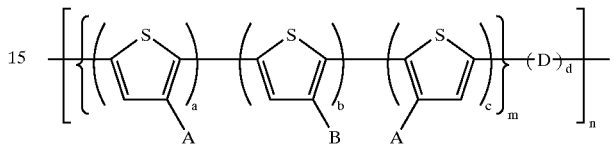

(III)

wherein A is a side chain; B is hydrogen or a side chain; D is a divalent linkage; a and c represent the number of A-substituted thienylenes; b is the number of B-substituted thienylenes; d is 0 or 1; and n represents the degree of polymerization or the number of the monomer segments; a polythiophene wherein A contains from 5 to about 25 carbon atoms in length; B is hydrogen or short side chain containing, for example, from 1 to about 4 carbon atoms; D is optionally comprised of a saturated moiety of alkylene, —O—R—O—, —S—R—S—, —NH—R—NH—, wherein R is alkylene or arylene, or an unsaturated moiety of arylene or heteroaromatics; a is from about 1 to about 8 and c is from 0 to about 8, and b is from zero to about 6; a polythiophene represented by:

(1)

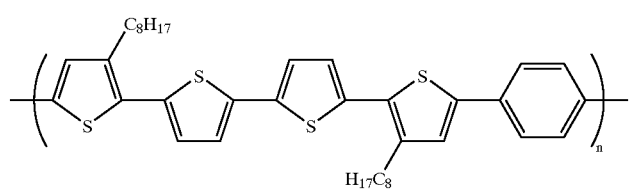

(2)

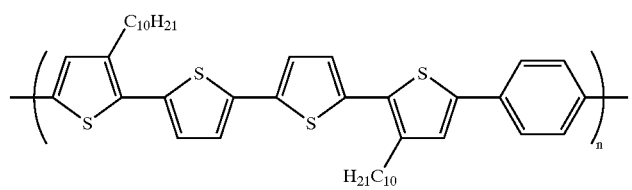

(3)

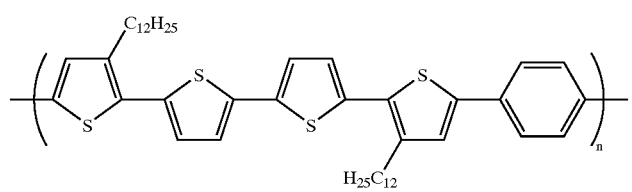

(4)

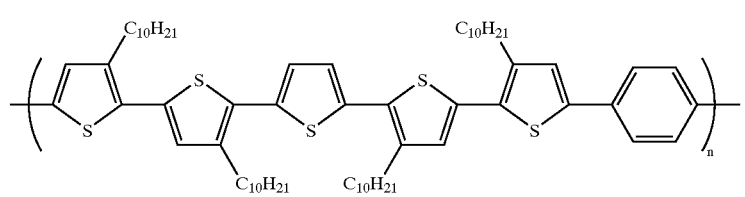

-continued
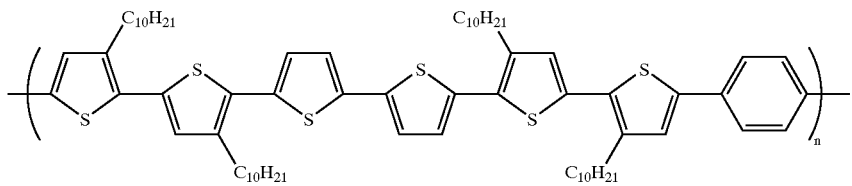
(5)
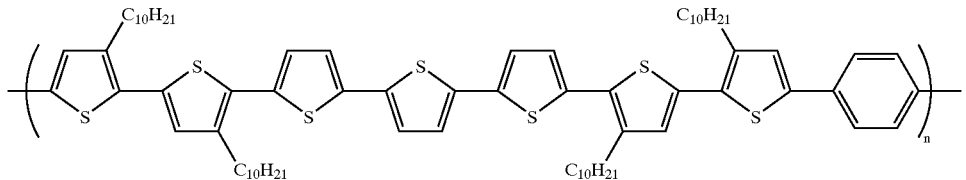
(6)
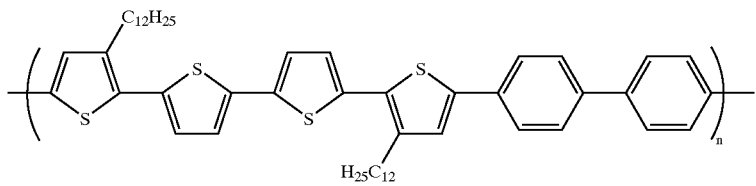
(7)
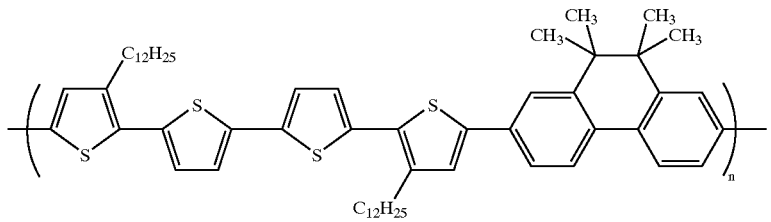
(8)
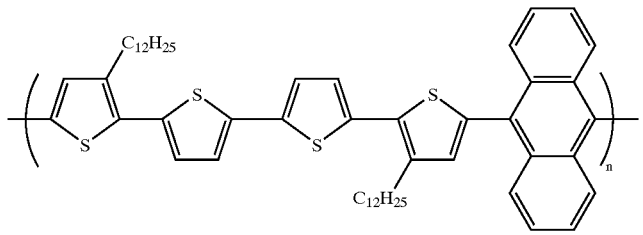
(9)
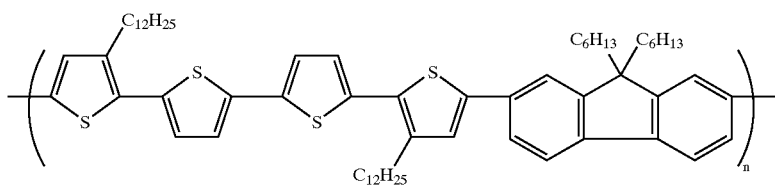
(10)
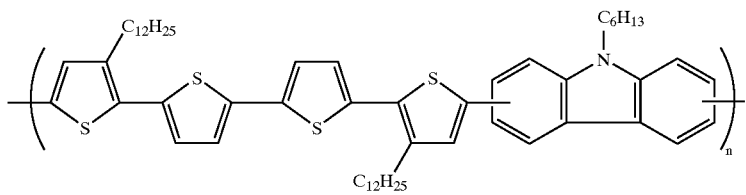
(11)
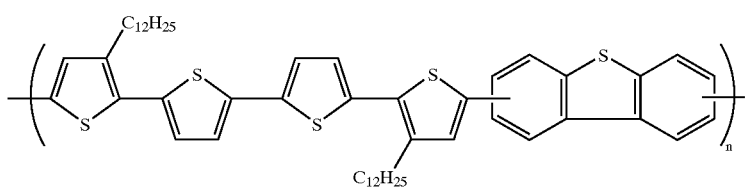
(12)

-continued
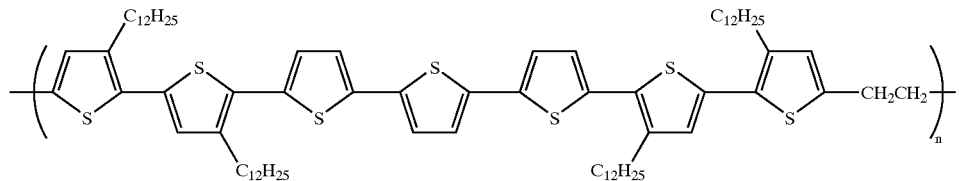
(13)
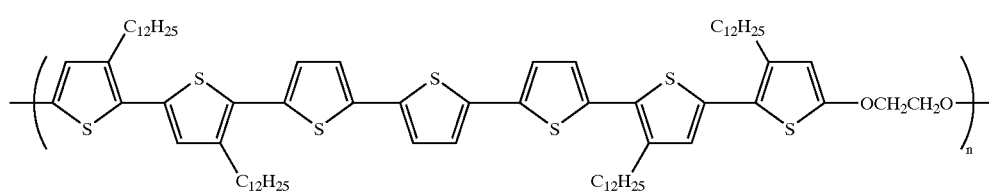
(14)
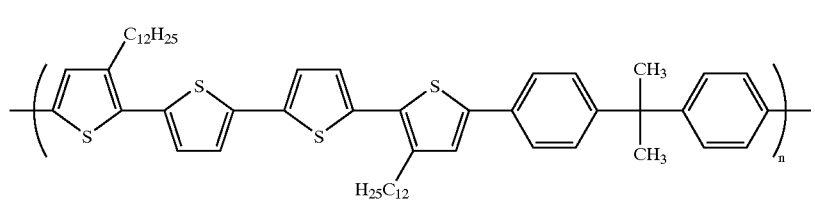
(15)
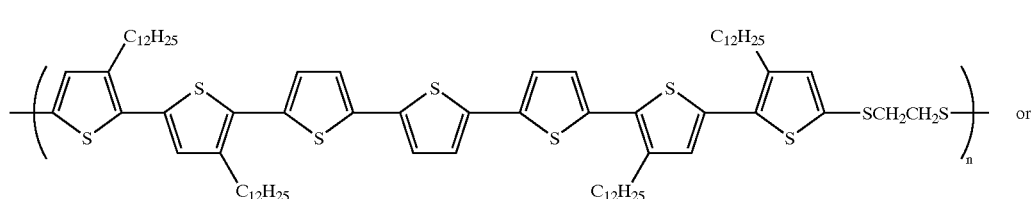
(16)
or
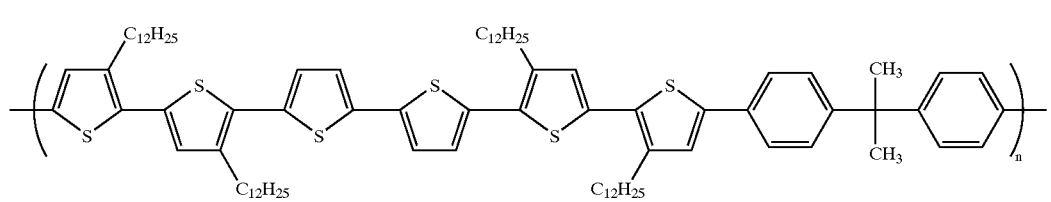
(17)
and wherein n represents the number of segments; a polythiophene wherein the polythiophene is represented by the following formulas:
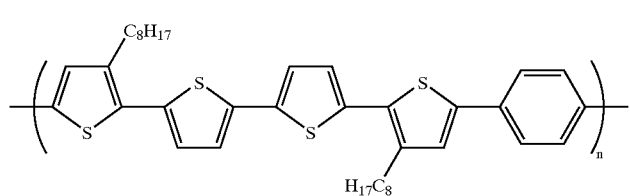
(1)
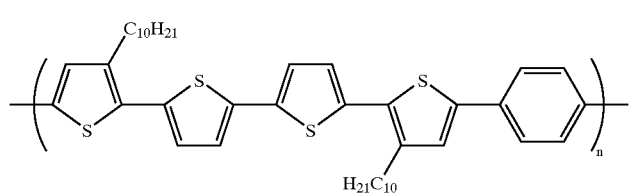
(2)

-continued

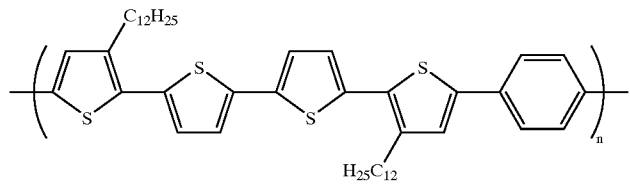

(3)

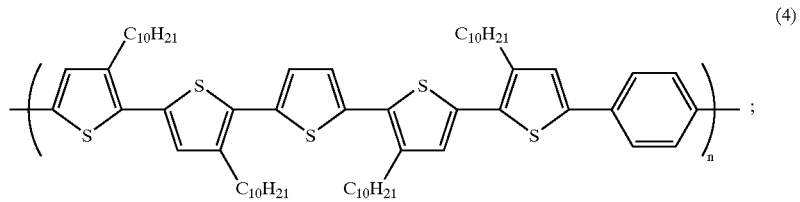

(4)

a polythiophene wherein A is alkyl, and B is alkyl; a polythiophene wherein A is alkyl containing from about 1 to about 25 carbon atoms, and B is hydrogen or a short alkyl containing from 1 to about 4 carbon atoms; a polythiophene wherein A contains from about 5 to about 25 carbon atoms, and B contains from about 1 to about 4 carbon atoms; a polythiophene wherein a is from about 1 to about 7; a polythiophene wherein b is from about 1 to about 7; a polythiophene wherein d is zero; a polythiophene wherein d is 1; a polythiophene wherein n is from about 5 to about 5,000; a polythiophene wherein n is from about 5 to about 3,000; a polythiophene wherein n is from about 2,000 to about 4,000; a polythiophene wherein A is alkyl containing from about 6 to about 25 carbon atoms; B is hydrogen or alkyl containing from 1 to about 3 carbon atoms; D is arylene or dioxyarene, each containing from about 6 to about 40 carbon atoms, or alkylene or dioxyalkane, each containing from about 1 to about 20 carbon atoms; a polythiophene wherein A is alkyl containing from about 6 to about 12 carbon atoms, and B is a hydrogen atom; a polythiophene wherein A is alkyl containing from 5 to about 15 carbon atoms; B is a hydrogen atom; D is arylene; a, b, c, and m are independently selected from the numbers 1, 2, and 3; and d=1; a polythiophene wherein A is alkyl containing from about 6 to about 12 carbon atoms; B is a hydrogen atom; D is arylene; a=c=m=1; b=2; and d=1; a polythiophene wherein n is from about 5 to about 5,000; a polythiophene wherein the number average molecular weight ($M_n$) of (III) is from about 10,000 to about 30,000, and the weight average molecular weight ($M_w$) is from about 15,000 to about 100,000; a polythiophene wherein the number average molecular weight ($M_n$) of (III) is from about 2,000 to about 100,000, and wherein the weight average molecular weight ($M_w$) is from about 4,000 to about 500,000, each as measured by gel permeation chromatography using polystyrene standards; a polythiophene wherein A is hexyl heptyl, octyl, nonyl, decyl, undecyl, dodecyl, tridecyl, tetradecyl, or pentyldecyl; a polythiophene wherein D is an arylene selected from the group consisting of phenylene, tolylene, xylylene, biphenylene, substituted biphenylene, fluorenylene, phenanthrenylene, dihydrophenanthrenylene, dibenzofuranediyl, dibenzothiophenediyl, and carbazolediyl; a polythiophene wherein D is saturated linkage selected from the group consisting of alkylene, dioxyalkane, dioxyarene, and oligoethylene oxide; a polythiophene wherein the polythiophene is represented by or encompassed by the following formulas, and wherein n represents the number of repeating segments, and is a number of from about 5 to about 4,000:

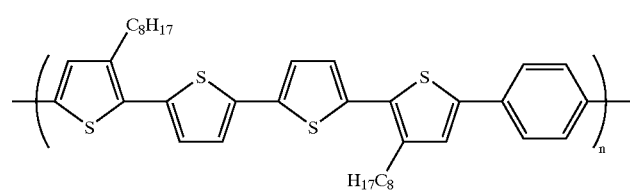

(1)

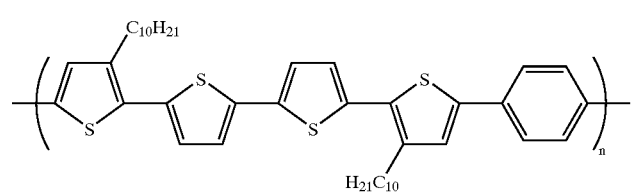

(2)

(3)
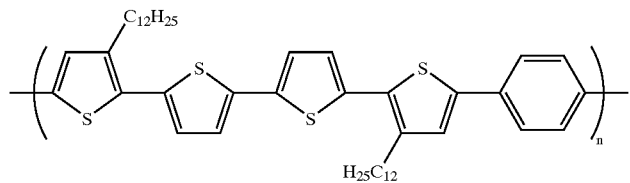
(4)
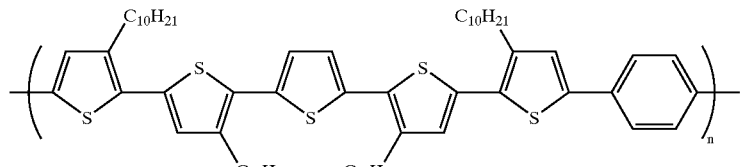
(5)
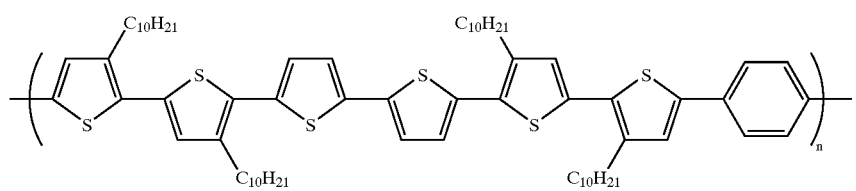
(6)
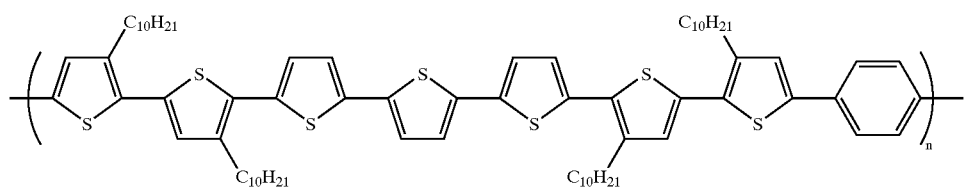
(7)
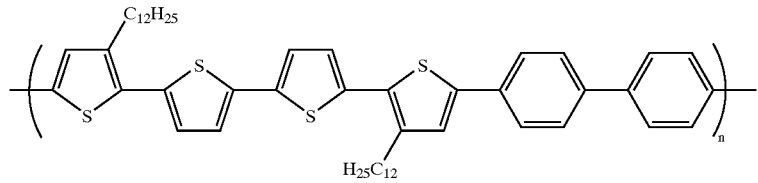
(8)
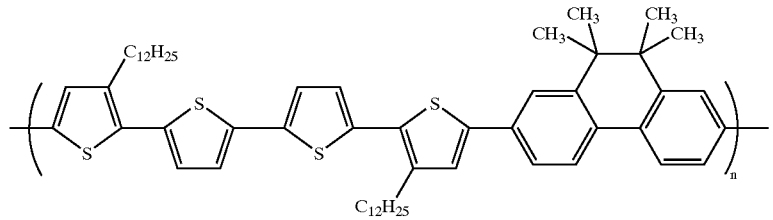
(9)
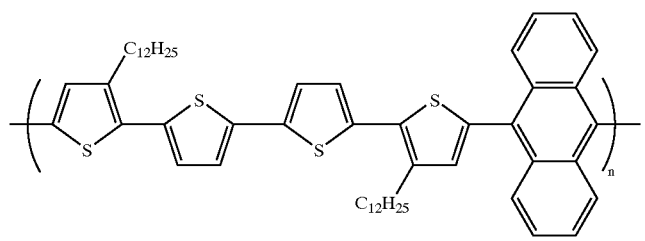
(10)
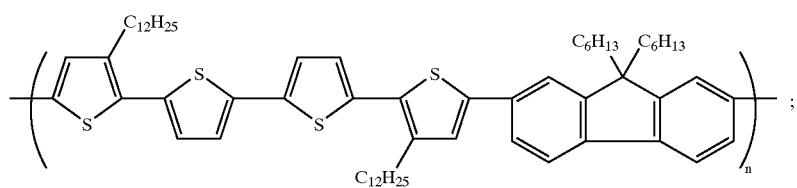;

a polythiophene wherein the polythiophene is:

(2)
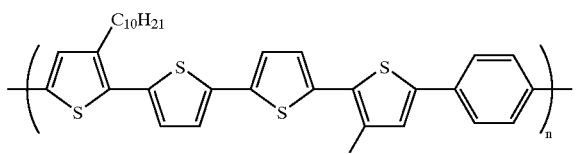

(3)
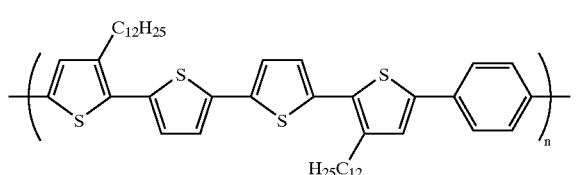

(4)
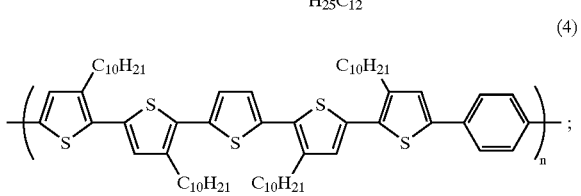

a polythiophene wherein the monomer segments thereof contain:

(I)
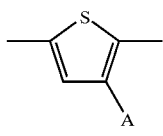

(II)
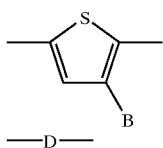

wherein A is a side chain; B is hydrogen or a side chain; and D is a divalent linkage, and wherein the number of A-substituted thienylene units (I) in the monomer segment is from about 1 to about 10, the number of B-substituted thienylene units (II) is from 0 to about 5, and the number of divalent linkage D is 0 or 1; and polythiophenes generated from a monomer segment containing two types of 2,5-thienylene units, (I) and (II) and a divalent linkage D in suitable proportions:

(I)
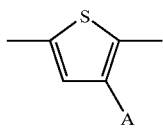

(II)
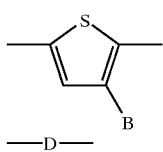

wherein A is a long side chain containing, for example, about 5 to about 25 atoms in length; B is hydrogen atom or a short side chain containing, for example, less than or about 4 carbon atoms in length, and more specifically, from about 1 to about 3 carbon atoms in length; and D is a divalent unit such as a saturated moiety of, for example, methylene, ethylene, propylene, butylene, pentylene and the like, or an unsaturated moiety of, for example, aryl, such as arylene biarylene, fluorenylene, and the like. The number of A-substituted thienylene units (I) in the monomer segments can, for example, be from about 1 to about 10, the number of B-substituted thienylene units (II) can be from 0 to about 5; and the number of divalent segment D can be, for example, 0 or 1.

The polythiophenes of the present invention in embodiments can be illustrated by Formula (III):

(III)
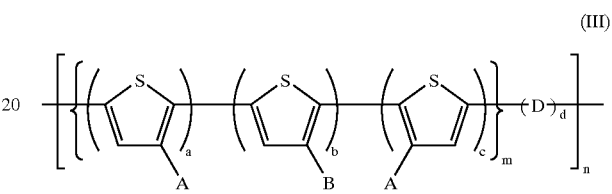

wherein A is a long side chain containing, for example, 5 to 25 atoms in length; B is hydrogen atom or a short side chain containing, for example 4 or less than about 4 carbon atoms in length; D is a divalent segment, such as saturated moiety, such as an alkylene like methylene, ethylene, propylene, and the like, or an unsaturated moiety like arylene, biarylene, fluorenylene, and the like; a and c are the number of A-substituted thienylenes with a being, for example, from about 1 to about 8 and c being, for example, from 0 to about 8; b is the number of B-substituted thienylene units and can be, for example, from 0 to about 5; d is, for example, 0 or 1; and n is the degree of polymerization or the number of the monomer segments in the polythiophene (III), and can be, for example, from about 5 to over 5,000, and more specifically, from about 10 to about 1,000. The number average molecular weight ($M_n$) of the polythiophenes of the present invention can be, for example, from about 2,000 to about 100,000, and more specifically, from about 4,000 to about 50,000, and their weight average molecular weight ($M_w$) can be from about 4,000 to about 500,000, and more specifically, from about 5,000 to about 100,000 both as measured by gel permeation chromatography using polystyrene standards.

Examples of A include alkyl containing, for example, from about 5 to about 30 carbon atoms, such as pentyl, hexyl, heptyl, octyl, nonyl, decyl, undecyl, dodecyl, tridecyl, tetradecyl, pentyldecyl, and the like, alkoxyalkyl, such as for example methoxybutyl, methoxyhexyl, methoxyhexyl, methoxyheptyl, and the like, a polyether chain, such as polyethylene oxide, perhaloalkyl, such as perfluoroalkyl, a polysiloxy chain, such as a trialkylsiloxyalkyl derivative, and the like; examples of B include hydrogen, halogen or halide, such as chloro, fluoro, or bromo atoms, alkyl like methyl, ethyl, propyl, alkoxy, such as methoxy, ethoxy, propoxy, butoxy and the like. Examples of the divalent linkage D are alkylene, such as methylene, ethylene, dialkylmethylene, propylene, and the like; arylene such as phenylene, biphenylene, phenanthrenylene, dihydrophenanthrenylene, fluorenylene, oligoarylene, and the like; and dioxyalkylene, dioxyarylene, oligoethylene oxide, and the like.

Specific illustrative polythiophenes include the following, and wherein n represents the number of segments:
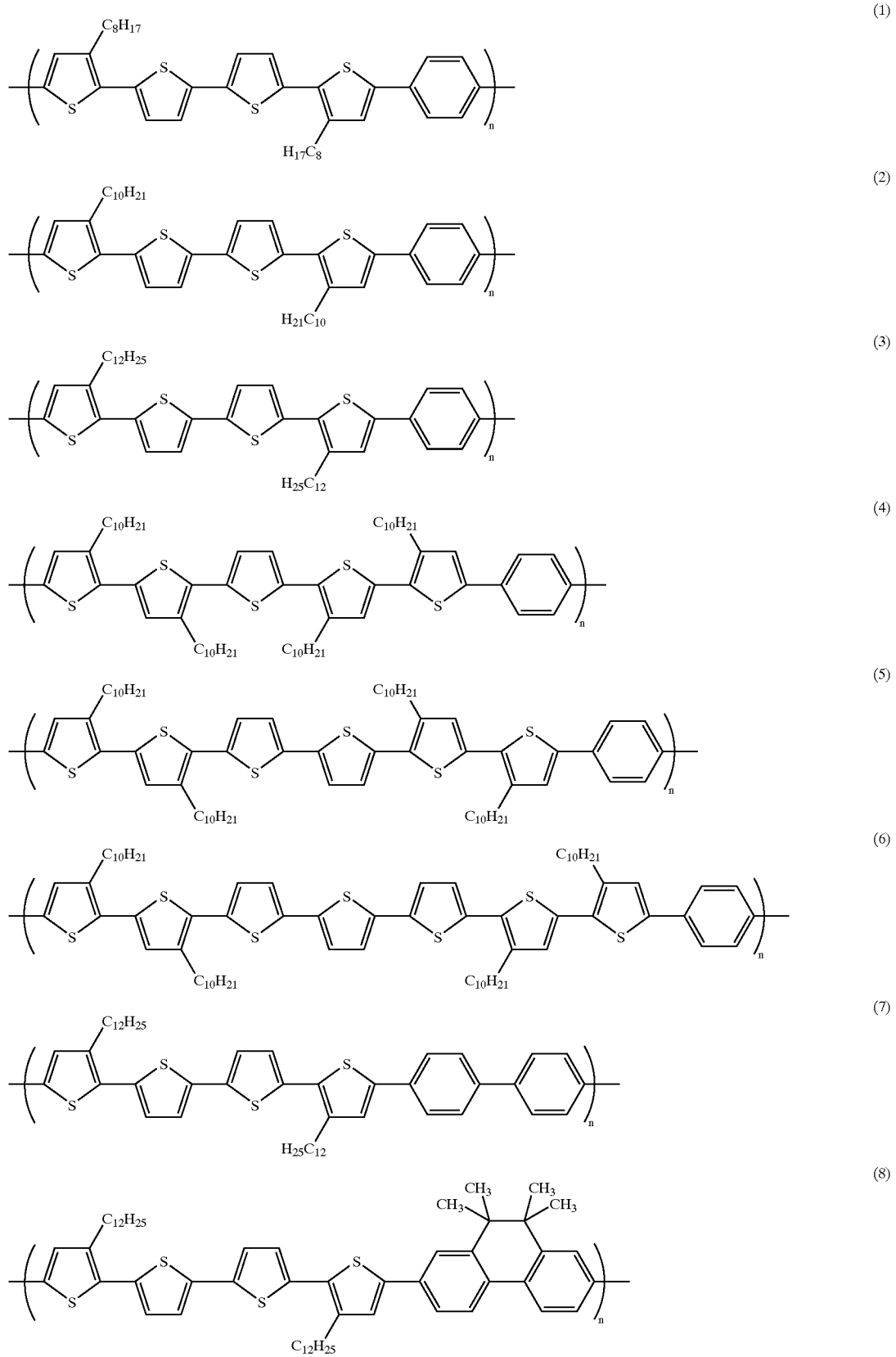

-continued
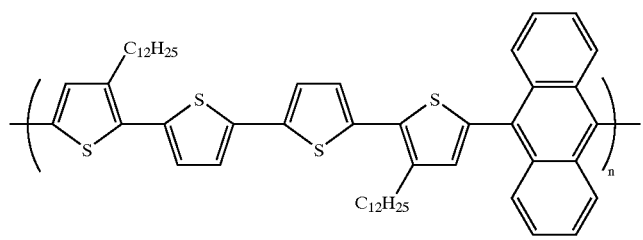
(9)
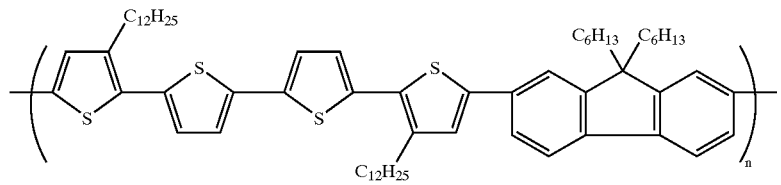
(10)
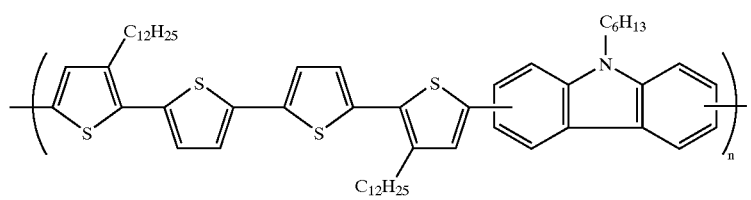
(11)
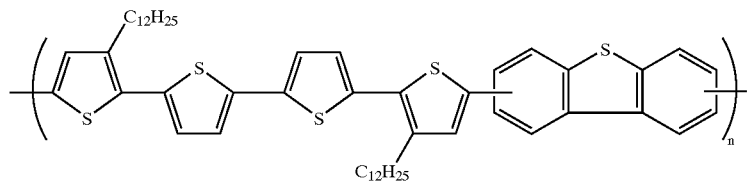
(12)
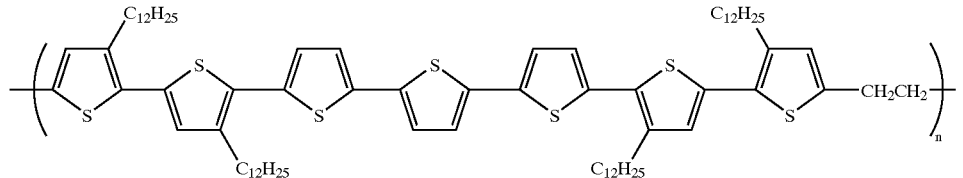
(13)
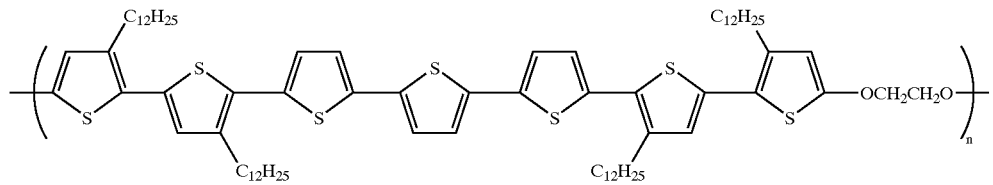
(14)
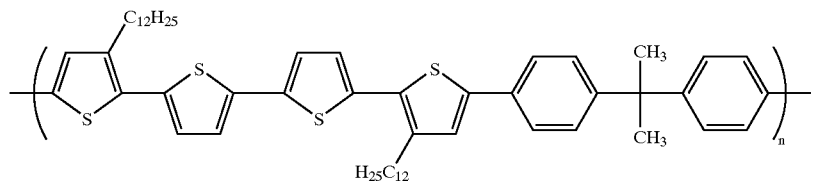
(15)
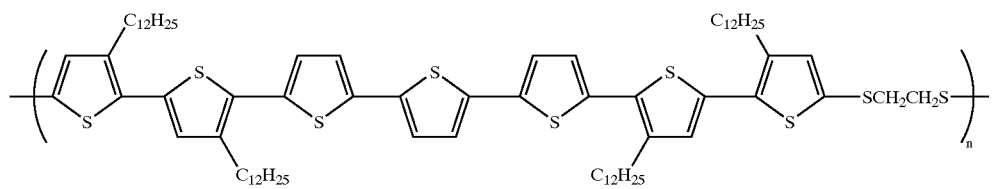
(16)

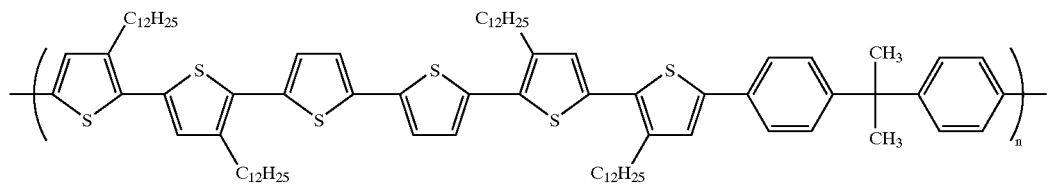
(17)

The polythiophenes of the present invention in embodiments are soluble in common organic coating solvents, for example they possess a solubility of at least about 0.1 percent by weight, and more specifically, from about 0.5 percent to about 5 percent by weight in such solvents as methylene chloride, 1,2-dichloroethane, tetrahydrofuran, toluene, xylene, mesitylene, chlorobenzene, and the like. Moreover, the polythiophenes of the present invention in embodiments when fabricated as semiconductor channel layers in thin film transistor devices provide a stable conductivity of, for example, from about $10^{-9}$ S/cm to about $10^{-6}$ S/cm, and more specifically, from about $10^{-8}$ S/cm to about $10^{-7}$ S/cm as determined by conventional four-probe conductivity measurements.

toluene, in the presence of about 2 to about 6 molar percent of tetrakis(triphenylphosphine)-palladum, about 2 to about 4 molar equivalent of an inorganic base, such as sodium carbonate, in the form of a 1M to 2M aqueous solution, and about 1 to 5 mole percent of a phase transfer catalyst, such as tetrabutylamomonium chloride or tricaprylylmethylammonium chloride at a temperature of, for example, from about 80° C. to about at about 100° C. under an inert atmosphere. After the polymerization, the polythiophene product, such as (V), is isolated by precipitation from methonol, optionally followed by soxhlet extraction with appropriate solvents such as methanol, toluene, and chlorobenzene.

Scheme 1

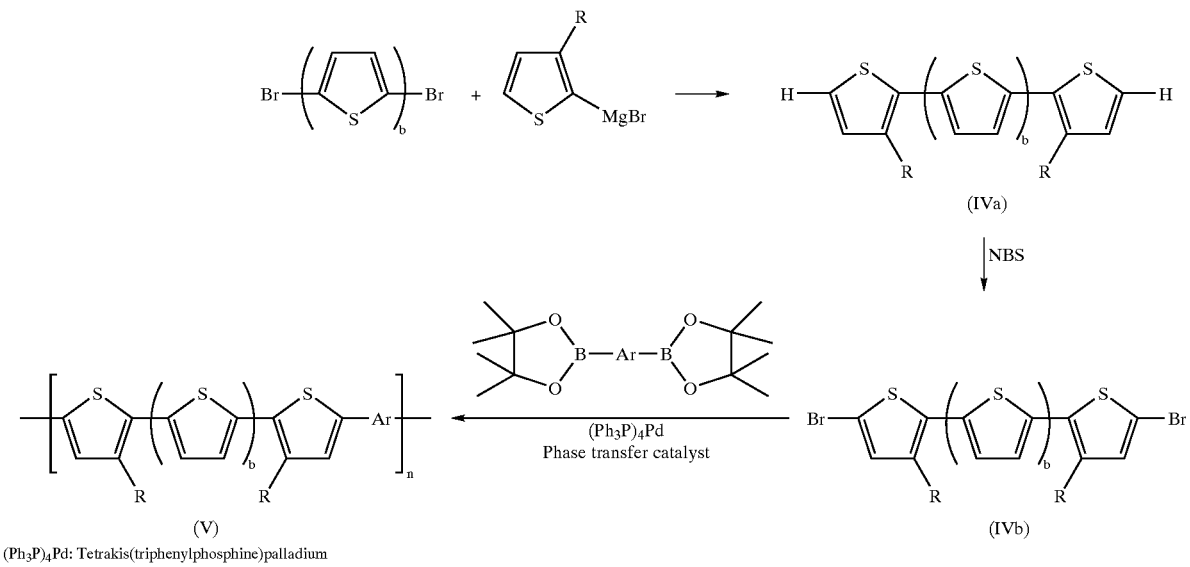

$(Ph_3P)_4Pd$: Tetrakis(triphenylphosphine)palladium

A number of synthetic procedures are suitable for the preparation of the polythiophenes of the present invention, each depending primarily on the specific polythiophenes desired. For example, polythiophene (V), a member of the polythiophene class represented by general Formula (III) with a=c=d=m=1, B=H, and D=Ar (arylene), can be prepared from the Suzuki coupling reaction of a properly constructed oligothiophene monomer (IVb) with an appropriate arylenediboronate. Specifically, (IVb) can be obtained from bromination of (IVa), which in turn is obtained from the reaction of 2-bromo-3-alkylthiophene and oligothiophenedibromide, reference Scheme 1. The Suzuki coupling polymerization is generally accomplished by heating with stirring a mixture of equal molar equivalents of (IVb) and arylene-diboronate in a suitable solvent, such as

FIGURES

In FIG. 1 there is schematically illustrated a TFT configuration 10 comprised of a substrate 16, in contact therewith a metal contact 18 (gate electrode) and a layer of an insulating dielectric layer 14 on top of which two metal contacts, 20 and 22 (source and drain electrodes), are deposited. Over and between the metal contacts 20 and 22 is the polythiophene semiconductor layer 12 as illustrated herein.

Figure 2:
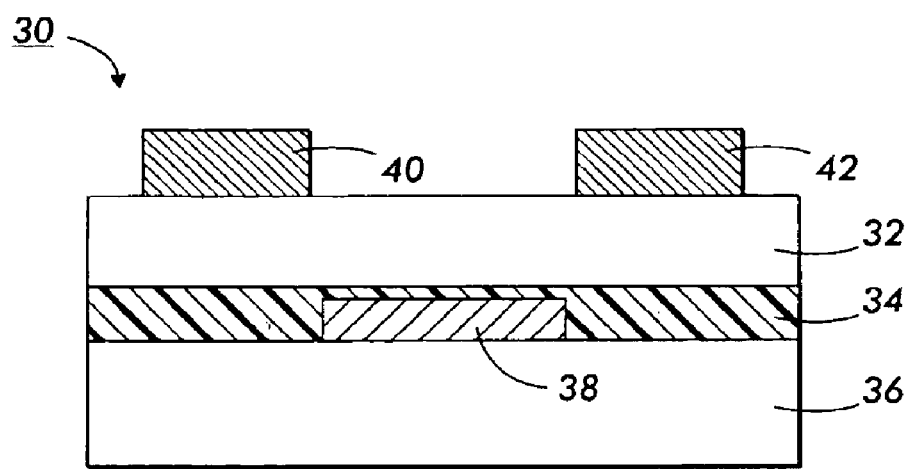

FIG. 2 schematically illustrates a TFT configuration 30 comprised of a substrate 36, a gate electrode 38, a source electrode 40 and a drain electrode 42, an insulating dielectric layer 34, and the polythiophene semiconductor layer 32.

Figure 3:
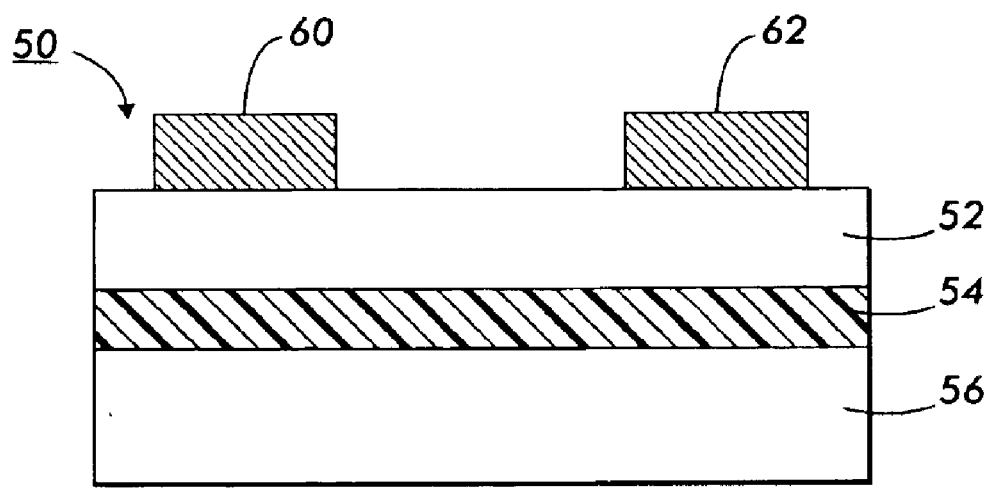

FIGS. 3 schematically illustrates another TFT configuration 50 comprised of a heavily n-doped silicon wafer 56 which acts as a gate electrode, a thermally grown silicon oxide dielectric layer 54, and the polythiophene semiconductor layer 52, on top of which are deposited a source electrode 60 and a drain electrode 62.

Figure 4:
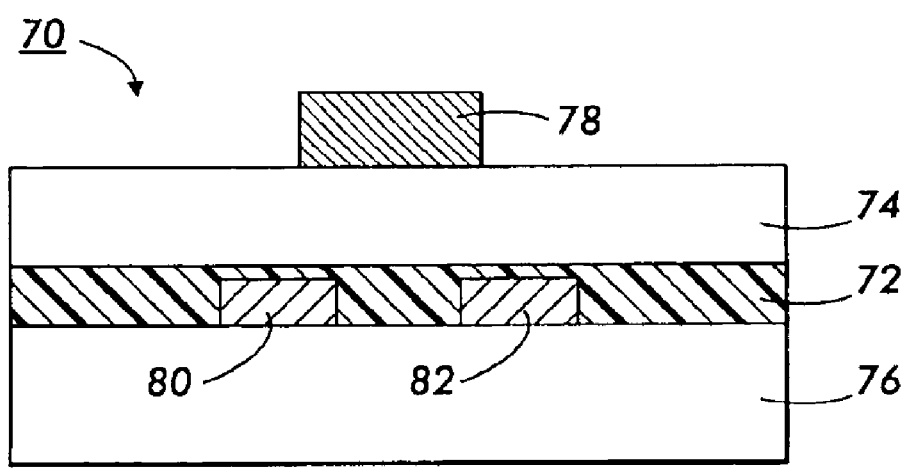

FIG. 4 schematically illustrates an additional TFT configuration 70 comprised of substrate 76, a gate electrode 78, a source electrode 80, a drain electrode 82, the polythiophene semiconductor layer 72, and an insulating dielectric layer 74.

In some embodiments of the present invention, an optional protecting layer, such as a polymer, may be incorporated on top of each of the transistor configurations of FIGS. 1, 2, 3 and 4. For the TFT configuration of FIG. 4, the insulating dielectric layer 74 may also function as a protecting layer.

In embodiments and with further reference to the present invention and the Figures, the substrate layer may generally be a silicon material inclusive of various appropriate forms of silicon, a glass plate, a plastic film or a sheet, and the like depending on the intended applications. For structurally flexible devices, a plastic substrate, such as for example polyester, polycarbonate, polyimide sheets, and the like, may be selected. The thickness of the substrate may be, for example, from about 10 micrometers to over 10 millimeters with a specific thickness being from about 50 to about 100 micrometers, especially for a flexible plastic substrate and from about 1 to about 10 millimeters for a rigid substrate such as glass or silicon.

The insulating dielectric layer, which can separate the gate electrode from the source and drain electrodes, and in contact with the semiconductor layer, can generally be an inorganic material film, an organic polymer film, or an organic-inorganic composite film. The thickness of the dielectric layer is, for example, from about 10 nanometers to about 1 micrometer with a more specific thickness being about 100 nanometers to about 500 nanometers. Illustrative examples of inorganic materials suitable as the dielectric layer include silicon oxide, silicon nitride, aluminum oxide, barium titanate, barium zirconate titanate, and the like; illustrative examples of organic polymers for the dielectric layer include polyesters, polycarbonates, poly(vinyl phenol), polyimides, polystyrene, poly(methacrylate)s, poly (acrylate)s, epoxy resin, and the like; and illustrative examples of inorganic-organic composite materials include nanosized metal oxide particles dispersed in polymers such as polyester, polyimide, epoxy resin and the like. The insulating dielectric layer is generally of a thickness of from about 50 nanometers to about 500 nanometers depending on the dielectric constant of the dielectric material used. More specifically, the dielectric material has a dielectric constant of, for example, at least about 3, thus a suitable dielectric thickness of about 300 nanometers can provide a desirable capacitance, for example, of about $10^{-9}$ to about $10^{-7}$ F/cm$^2$.

Situated, for example, between and in contact with the dielectric layer and the source/drain electrodes is the active semiconductor layer comprised of the polythiophenes illustrated herein, and wherein the thickness of this layer is generally, for example, about 10 nanometers to about 1 micrometer, or about 40 to about 100 nanometers. This layer can generally be fabricated by solution processes, such as spin coating, casting, screen, stamp, or jet printing of a solution of the polythiophenes of the present invention.

The gate electrode can be a thin metal film, a conducting polymer film, a conducting film generated from a conducting ink or paste, or the substrate itself (for example heavily doped silicon). Examples of gate electrode materials include but are not limited to aluminum, gold, chromium, indium tin oxide, conducting polymers, such as polystyrene sulfonate-doped poly(3,4-ethylenedioxythiophene) (PSS/PEDOT), a conducting ink/paste comprised of carbon black/graphite or colloidal silver dispersion contained in a polymer binder, such as ELECTRODAG available from Acheson Colloids Company and silver filled electrically conductive thermoplastic ink available from Noelle Industries, or the like. The gate layer can be prepared by vacuum evaporation, sputtering of metals or conductive metal oxides, coating from conducting polymer solutions or conducting inks or dispersions by spin coating, casting or printing. The thickness of the gate electrode layer is, for example, from about 10 nanometers to about 10 micrometers, and a specific thickness is, for example, from about 10 to about 200 nanometers for metal films and about 1 to about 10 micrometers for polymer conductors.

The source and drain electrode layer can be fabricated from materials which provide a low resistance ohmic contact to the semiconductor layer. Typical materials suitable for use as source and drain electrodes include those of the gate electrode materials such as gold, nickel, aluminum, platinum, conducting polymers, and conducting inks. Typical thickness of this layer is about, for example, from about 40 nanometers to about 1 micrometer with the more specific thickness being about 100 to about 400 nanometers. The TFT devices contain a semiconductor channel with a width W and length L. The semiconductor channel width may be, for example, from about 10 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of generally about 0 volt to about 80 volts is applied to the drain electrode to collect the charge carriers transported across the semiconductor channel when a voltage of generally about +10 volts to about −80 volts is applied to the gate electrode.

The following Examples are provided.

GENERAL PROCEDURE a) Device Fabrication:

There was selected a top-contact thin film transistor configuration as schematically described by FIG. 3 as the primary test device structure.

The test device was comprised of an n-doped silicon wafer with a thermally grown silicon oxide layer of a thickness of about 110 nanometers thereon. The wafer functioned as the gate electrode while the silicon oxide layer acted as the gate dielectric and had a capacitance of about 32 nF/cm$^2$ (nanofarads/square centimeter). The fabrication of the device was accomplished in ambient conditions without taking any precautions to exclude the materials and device from exposure to ambient oxygen, moisture, or light. The silicon wafer was first cleaned with methanol, air dried, and then immersed in a 0.01 M solution of 1,1,1,3,3,3-hexamethyldisilazane in dichloromethane for 30 minutes at room temperature. Subsequently, the wafer was washed with dichloromethane and dried. The test semiconductor polythiophene layer of about 30 nanometers to about 100 nanometers in thickness was then deposited on top of the silicon oxide dielectric layer by spin coating at a speed of 1,000 rpm for about 35 seconds, and dried in vacuo at 80° C. for 20 hours. The solution used in fabricating the semiconductor layer was comprised of 1 percent by weight of the polythiophene in an appropriate solvent, and was filtered through a 0.45 μm filter before use. Thereafter, the gold source and drain electrodes were deposited on top of the semiconductor polythiophene layer by vacuum deposition through a shadow mask with various channel lengths and widths, thus providing a series of transistors of various dimensions. For consistency, the devices after fabrication were kept in a dry atmosphere of about 30 percent relative humidity in the dark before and after evaluation.

b) TFT Device Characterization:

The evaluation of field-effect transistor performance was accomplished in a black box at ambient conditions using a Keithley 4200 SCS semiconductor characterization system. The carrier mobility, $\mu$, was calculated from the data in the saturated regime (gate voltage, $V_G$<source-drain voltage, $V_{SD}$) accordingly to equation (1)

$$I_{SD}=C_i \mu(W/2L)(V_G-V_T)^2 \quad (1)$$

where $I_{SD}$ is the drain current at the saturated regime, W and L are, respectively, the semiconductor channel width and length, Ci is the capacitance per unit area of the gate dielectric layer, and $V_G$ and $V_T$ are, respectively, the gate voltage and threshold voltage. $V_T$ of the device was determined from the relationship between the square root of $I_{SD}$ at the saturated regime and $V_G$ of the device by extrapolating the measured data to $I_{SD}$=0.

Another property of a field-effect transistor is its current on/off ratio. This is the ratio of the saturation source-drain current when the gate voltage $V_G$ is equal to or greater than the drain voltage $V_D$ to the source-drain current when the gate voltage $V_G$ is zero.

COMPARATIVE EXAMPLE

A series of comparative thin film transistors were fabricated containing the known regioregular polythiophene, poly(3-hexythiophene-2,5-diyl), which is commonly known as P3HT. This material was purchased from Aldrich Chemical and was purified by three successive precipitations of its solution in chlorobenzene from methanol.

The devices were fabricated in ambient conditions in accordance with the procedure as described hereinbefore. Using transistors with a dimension of W (width)=5,000 μm and L (length)=60 μm, the following average properties from at least five transistors were obtained:

| | |
|---|---|
| Mobility: | 1 to 1.2 × $10^{-2}$ cm$^2$/V · sec |
| Initial on-off ratio: | 1.5 to 2.1 × $10^3$ |
| On-off ratio after 5 days: | 5 to 10 |

The observed low initial current on/off ratios are an indication of the propensity of poly(3-hexythiophene-2,5-diyl) towards oxidative doping, that is the instability of poly(3-hexythiophene-2,5-diyl) in the presence of ambient oxygen. The reductions in the current on/off ratios over just a five day period further confirm the functional instability of poly(3-hexythiophene-2,5-diyl) in ambient conditions.

EXAMPLE a) Preparation of Polythiophene (3):

Two monomers, 5,5'-bis(3-dodecyl-5-bromo-2-thienyl)-2,2'-dithiophene and 1,4-benzenebis(pinacolboronate), selected for the preparation of polythiophene (3) were prepared in the following manner.

5,5'-Bis(3-dodecyl-5-bromo-2-thienyl)-2,2'-dithiophene:

A solution of 2-bromo-3-dodecylthiophene (11.5 grams, 34.92 mmol) in 40 milliliters of anhydrous tetrahydrofuran (THF) was added slowly over a period of 20 minutes to a mechanically stirred suspension of magnesium turnings (1.26 grams, 51.83 mmol) in 10 milliliters of THF in a 100 milliliter round-bottomed flask under an inert argon atmosphere. The resultant mixture was stirred at room temperature, of about 22° C. to about 25° C., for 2 hours and then at 50° C. for 20 minutes before cooling down to room temperature. The resultant mixture was then added via a cannula to a mixture of 5,5'-dibromo-2,2'-dithiophene (4.5 grams, 13.88 mmol) and [1,3-bis(diphenylphosphino)] dichloronickel (II) (0.189 gram, 0.35 mmol) in 80 milliliters of anhydrous THF in a 250 milliliter round-bottomed flask under an inert atmosphere, and refluxed for 48 hours. Subsequently, the reaction mixture was diluted with 200 milliliters of ethyl acetate, was washed twice with water, with a 5 percent aqueous hydrochloric acid (HCl) solution, and dried with anhydrous sodium sulfate. A dark brown syrup, obtained after evaporation of the solvent, was purified by column chromatography on silica gel, and further purified by recrystallization from a mixture of methanol and isopropanol yielding 5,5'-bis(3-dodecyl-2-thienyl)-2,2'-dithiophene in 55 percent yield; m.p. 58.9° C.

The NMR spectrum of the compound was recorded at room temperature using a Bruker DPX 300 NMR spectrometer:

$^1$H NMR (CDCl$_3$): δ 7.18 (d, J=5.4 Hz, 2H), 7.13 (d, J=3.6 Hz, 2H), 7.02 (d, J=3.6 Hz, 2H), 6.94 (d, J=5.4 Hz, 2H), 2.78 (t, 4H), 1.65 (q, 1.65, 4H), 1.28 (bs, 36H), 0.88 (m, 6H).

To a solution of 5,5'-bis(3-dodecyl-2-thienyl)-2,2'-dithiophene (0.61 gram, 9.22×$10^{-4}$ mmol) in 35 milliliters of 3/1 dichloromethane/acetic acid in a 3-necked flask under an argon atmosphere there was added in small portions solid N-bromosuccinimide (0.348 gram, 1.95×$10^{-3}$ mmol) over a period of 10 to 20 minutes. After 2 hours of reaction, the precipitated solid product was collected by filtration, and recrystallized from a mixture of dichloromethane and methanol. The yield was about 79 percent, m.p., 75.6° C.

$^1$H NMR (CDCl$_3$): δ 6.9 (s, 2H), 7.10 (d, J=3.9 Hz, 2H), 6.96 (d, J=4.2 Hz, 2H), 2.78 (t, 4H), 1.65 (q, 1.65, 4H), 1.28 (bs, 36H), 0.88 (m, 6H).

1,4-Benzenebis(pinacolboronate):

1.7 M of tert-butyllithium in pentane (121 milliliters, 205.7 mmol) was added dropwise by means of a syringe to a solution of 1,4-dibromobenzene (11.9 grams, 50.44 mmol) in 150 milliliters of anhydrous tetrahydrofuran in a 500 milliliter round-bottomed flask at about −75° C. to about −78° C. under an argon atmosphere, and allowed to react for 2 hours. 2-isopropoxy-4,4',5,5'-tetramethyl-1,3,2-dioxaborolane (65.69 grams, 353.08 mmol) was then added quickly by means of a syringe, and the reaction mixture was stirred at the same temperature for an additional 2 hours and then at room temperature for 12 hours. Subsequently, the reaction mixture was diluted with 150 milliliters of dichloromethane, and the solid materials were filtered off. The organic phase was washed 3 times with water, dried, and evaporated to provide the above boronate crude product which was recrystallized from hexane to provide a white solid in about 59 percent yield, m.p., 245.3° C.

$^1$H-NMR(CDCl$_3$): δ 7.8 (s, 4H), 1.3 (s, 24H).

Polymerization:

To a mixture of 5,5'-bis(3-dodecyl-5-bromo-2-thienyl)-2, 2'-dithiophene (0.5 gram, 0.61 mmol) and 1,4-benzenebis (pinacolboronate) (0.2 gram, 0.61 mmol) in 5 milliliters of toluene under an argon atmosphere was added a mixture of tetrakis(triphenylphosphine)-palladium (0.014 gram, 0.012 mmol), ALIQUART 336 (0.2 gram) in 2 milliliters of toluene, and 2 M of aqueous sodium carbonate solution (1.5 milliliters). The resultant mixture was heated at reflux with gentle stirring for 2 days. Thereafter, the reaction mixture was poured into methanol and the precipitated polythiophene product was collected by filtration. The polythiophene was purified by soxhlet extration with toluene and then precipitated from methnol to give 0.416 gram of polythiophene (3) as a dark redish solid.

b) Device Fabrication and Evaluation:

Thin film transistor devices were fabricated under ambient conditions using the above prepared polythiophene according to the general procedures illustrated herein. No precautions were taken to exclude ambient oxygen or light. Using transistors of the same dimension as that of the P3HT device (W=5,000 $\mu$m and L=60 $\mu$m), the following average properties from at least five transistors were obtained.

| | |
|---|---|
| Mobility: | 4.3 to 6.1 × $10^{-3}$ $cm^2$/V · sec |
| Initial on-off ratio: | 6.0 to 9.5 × $10^5$ |
| On-off ratio after 5 days: | 1.8 to 5.5 × $10^5$ |
| On-off ratio after 30 days: | 6.8 to 8.4 × $10^4$ |

The stability of the polythiophene semiconductor layer was demonstrated by the large initial current on/off rations and the slow reduction in current on/off ratio over time.

Other embodiments and modifications of the present invention may occur to those skilled in the art subsequent to a review of the information presented herein; these embodiments and modifications, equivalents thereof, substantial equivalents thereof, or similar equivalents thereof are also included within the scope of this invention.

What is claimed is:

1. A symmetrical polythiophene:

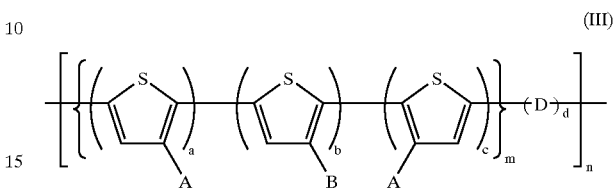

(III)

wherein A is a side chain; B is hydrogen or a side chain; D is a divalent linkage; a and c represent the number of A-substituted thienylenes; b is the number of B-substituted thienylene segments; d is 0 or 1; and n represents the degree of polymerization, and wherein A is alkyl, and said B side chain is alkyl.

2. A polythiophene represented by:

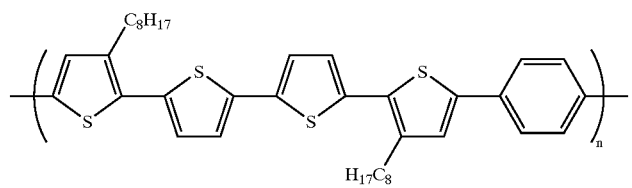

(1)

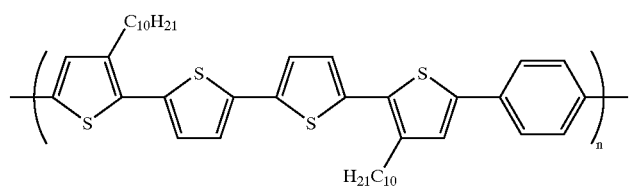

(2)

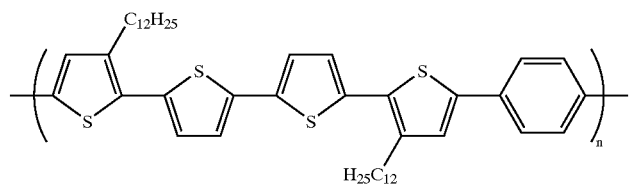

(3)

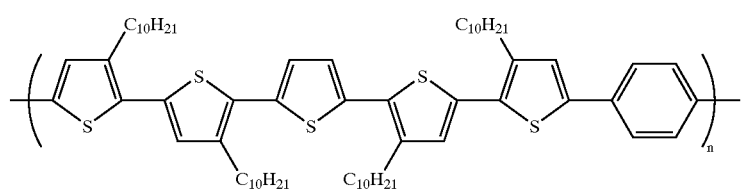

(4)

-continued
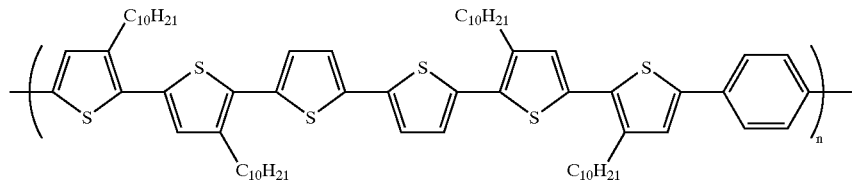
(5)
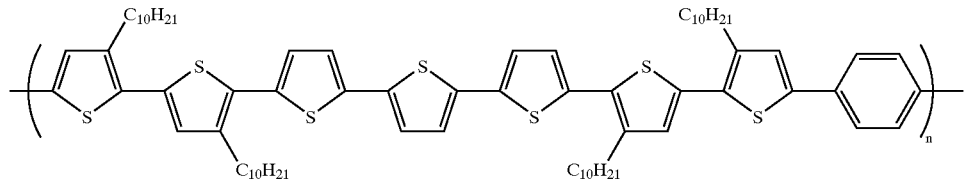
(6)
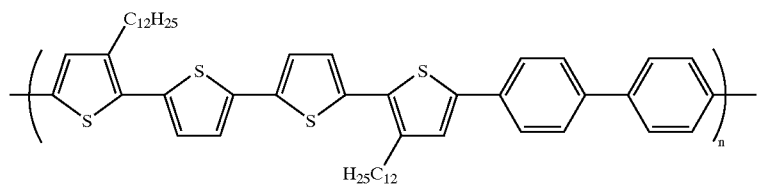
(7)
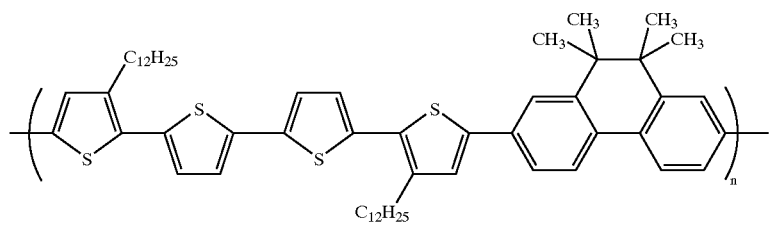
(8)
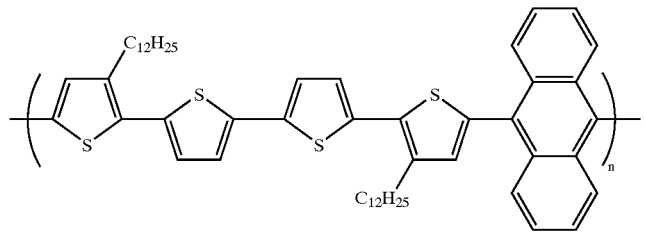
(9)
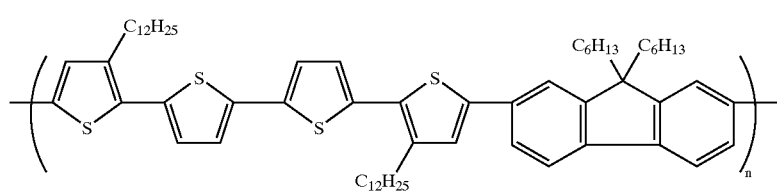
(10)
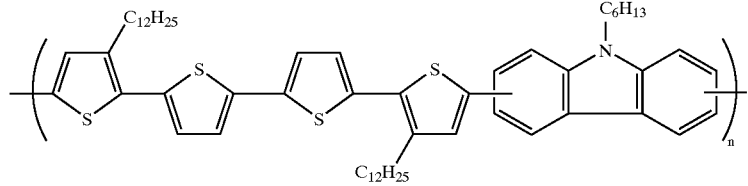
(11)
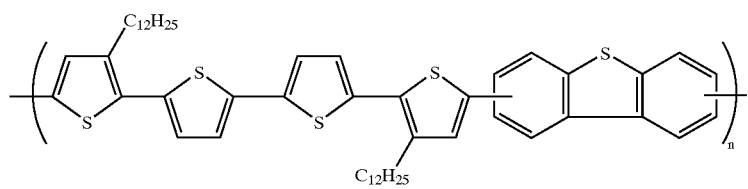
(12)

-continued
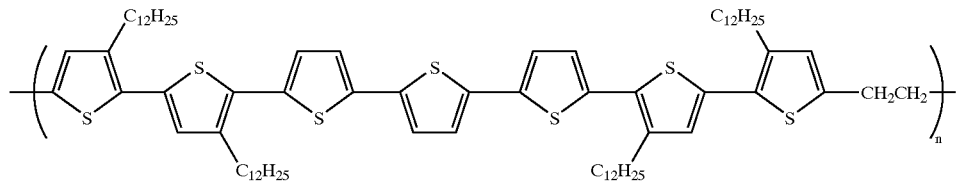
(13)
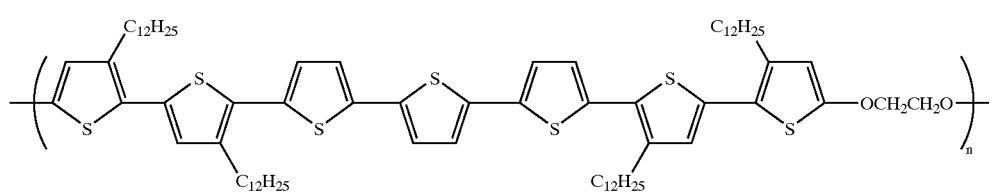
(14)
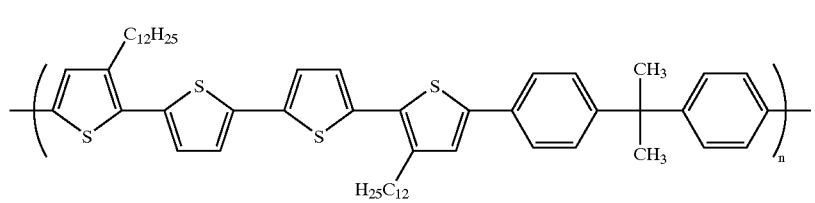
(15)
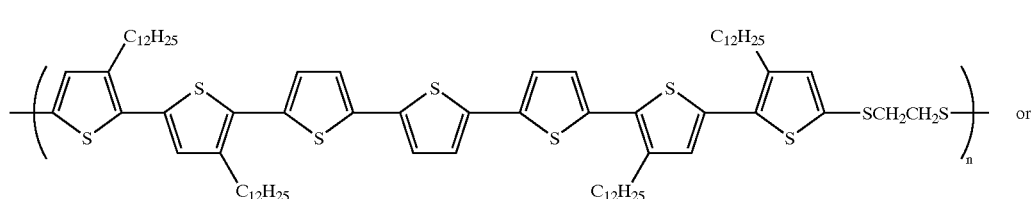
(16)
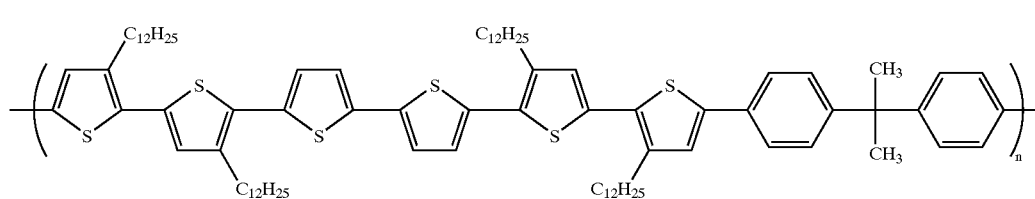
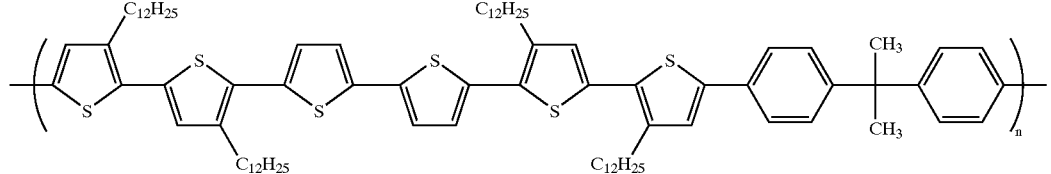
(17)
and wherein n represents the number of segments.
3. A polythiophene in accordance with claim 1 wherein said polythiophene is represented by the following formulas:
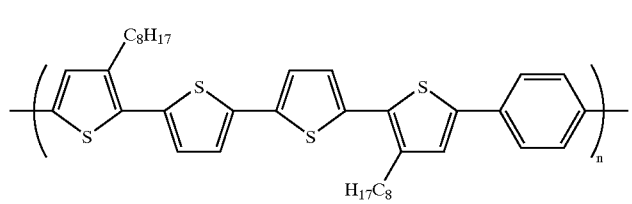
(1)
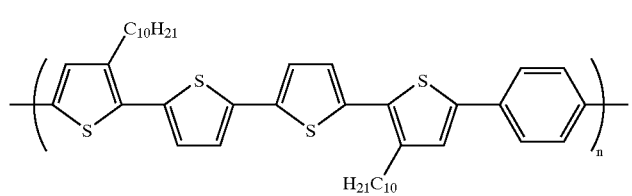
(2)

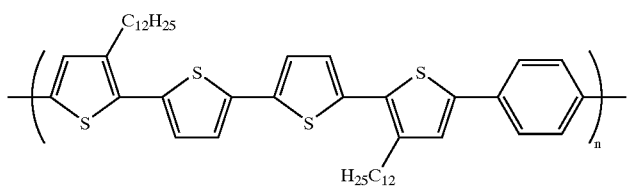

(3)

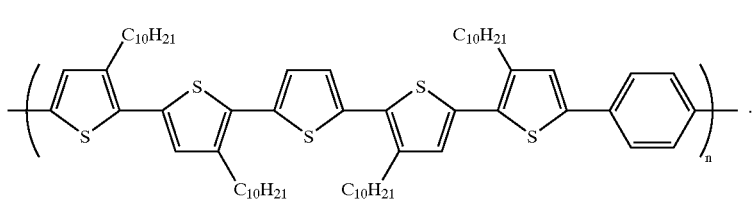

(4)

4. A polythiophene in accordance with claim 1 wherein A is alkyl containing from about 1 to about 25 carbon atoms, and B is alkyl containing from 0 to about 4 carbon atoms.

5. A polythiophene in accordance with claim 4 wherein A contains from about 5 to about 25 carbon atoms, and B contains from 0 to about 4 carbon atoms.

6. A polythiophene in accordance with claim 1 wherein a is from about 1 to about 7.

7. A polythiophene in accordance with claim 1 wherein b is from about 1 to about 7.

8. A polythiophene in accordance with claim 1 wherein d is zero.

9. A polythiophene in accordance with claim 1 wherein d is 1.

10. A polythiophene in accordance with claim 1 wherein n is from about 5 to about 5,000.

11. A polythiophene in accordance with claim 1 wherein n is from about 5 to about 3,000.

12. A polythiophene in accordance with claim 1 wherein n is from about 10 to about 1,000.

13. A polythiophene in accordance with claim 1 wherein A is alkyl containing from about 6 to about 25 carbon atoms; B is hydrogen or alkyl containing from 1 to about 3 carbon atoms; D is arylene or dioxyarene, each containing from about 6 to about 40 carbon atoms, or alkylene or dioxyalkane, each containing from about 1 to about 20 carbon atoms.

14. A polythiophene in accordance with claim 1 wherein A is alkyl containing from about 8 to about 12 carbon atoms, and B is a hydrogen atom.

15. A polythiophene in accordance with claim 1 wherein A is alkyl containing from 5 to about 15 carbon atoms; B is a hydrogen atom; D is arylene; a, b, c, and m are independently selected from the numbers 1, 2, and 3; and d=1.

16. A polythiophene in accordance with claim 1 wherein A is alkyl containing from about 8 to about 12 carbon atoms; B is a hydrogen atom; D is arylene; a=c=m=1; b=2; and d=1.

17. A polythiophene in accordance with claim 1 wherein n is from about 5 to about 5,000.

18. A polythiophene in accordance with claim 1 wherein the number average molecular weight ($M_n$) of (III) is from about 10,000 to about 30,000, and the weight average molecular weight ($M_w$) is from about 15,000 to about 100,000.

19. A polythiophene in accordance with claim 1 wherein the number average molecular weight ($M_n$) of (III) is from about 2,000 to about 100,000, and wherein the weight average molecular weight ($M_w$) is from about 4,000 to about 500,000, each as measured by gel permeation chromatography using polystyrene standards.

20. A polythiophene in accordance with claim 1 wherein A is hexyl heptyl, octyl, nonyl, decyl, undecyl, dodecyl, tridecyl, tetradecyl, or pentyldecyl.

21. A polythiophene in accordance with claim 1 wherein D is an arylene selected from the group consisting of phenylene, tolylene, xylylene, biphenylene, substituted biphenylene, fluorenylene, phenanthrenylene, dihydrophenanthrenylene, dibenzofuranediyl, dibenzothiophenediyl, and carbazolediyl.

22. A polythiophene in accordance with claim 1 wherein D is saturated linkage selected from the group consisting of alkylene, dioxyalkane, dioxyarene, and oligoethylene oxide.

23. A polythiophene in accordance with claim 1 wherein said polythiophene is represented by or encompassed by the following formulas, and wherein n represents the number of repeating segments, and is a number of from about 5 to about 4,000:

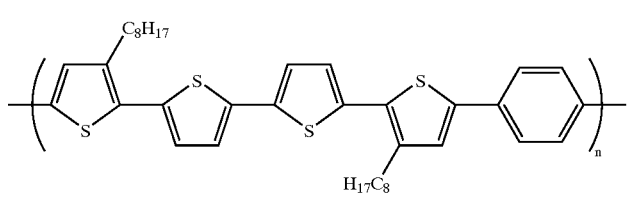

(1)

-continued
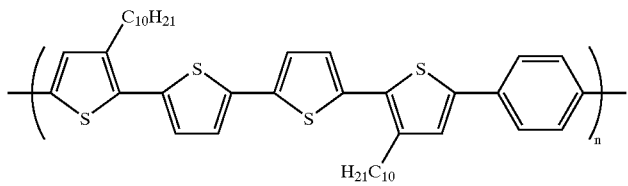
(2)
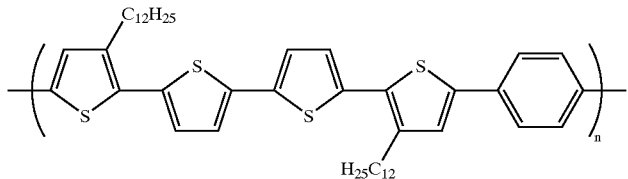
(3)
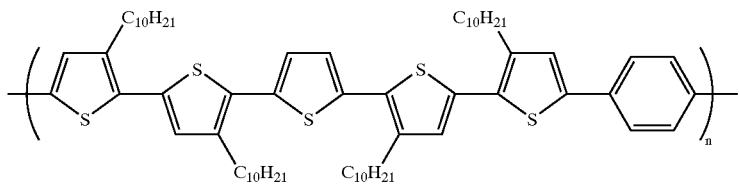
(4)
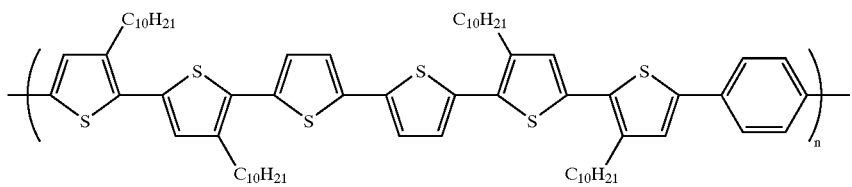
(5)
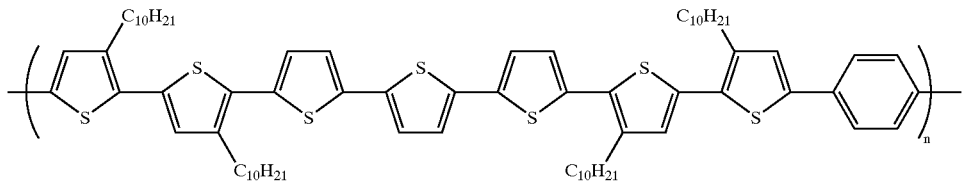
(6)
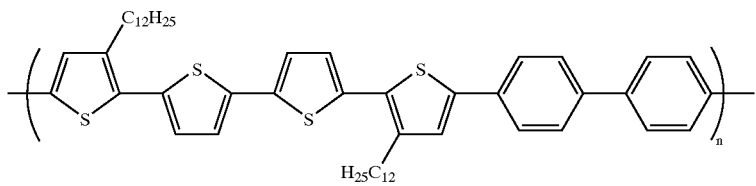
(7)
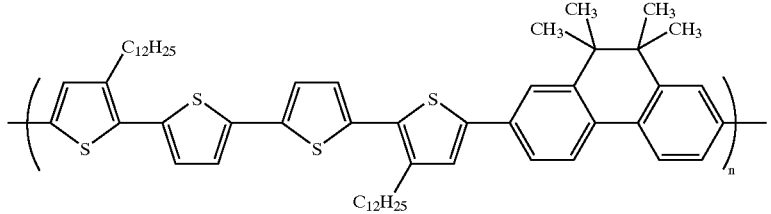
(8)
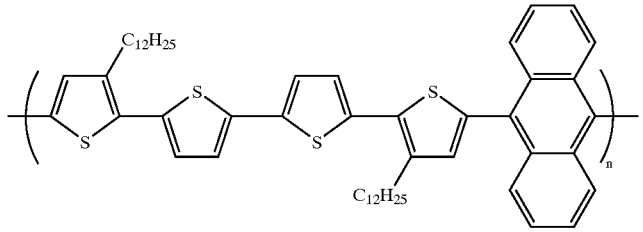
(9)

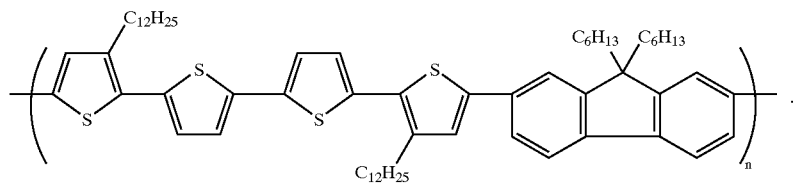
(10)

24. A polythiophene in accordance with claim 1 wherein said polythiophene is:

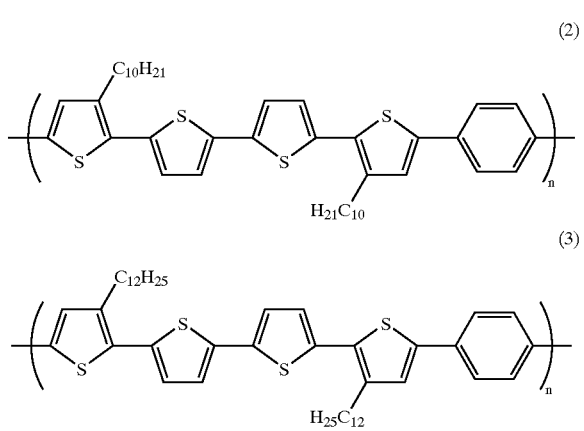

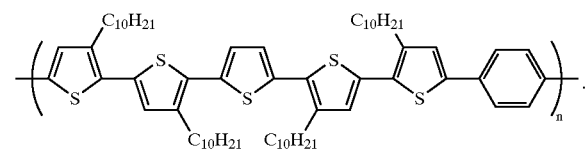

25. A polythiophene in accordance with claim 1 wherein A contains from 5 to about 25 carbon atoms; B contains from 1 to about 4 carbon atoms; said D is optionally comprised of a saturated moiety of alkylene, —O—R—O—, —S—R—S—, —NH—R—NH—, wherein R is alkylene or arylene, or an unsaturated moiety of arylene or heteroaromatics; a is from about 1 to about 8; b is from 1 to about 6; and c is from 1 to about 8.

* * * * *

UNITED STATES PATENT AND TRADEMARK OFFICE
CERTIFICATE OF CORRECTION

PATENT NO. : 6,872,801 B2
DATED : March 29, 2005
INVENTOR(S) : Ong et al.

It is certified that error appears in the above-identified patent and that said Letters Patent is hereby corrected as shown below:

Column 1,
Line 16, insert the following section:
-- STATEMENT REGARDING FEDERALLY SPONSORED RESEARCH OR DEVELOPMENT
This invention was made with United States Government support under Cooperative Agreement No. 70NANBOH3033 awarded by the National Institute of Standards and Technology (NIST). The United States Government has certain rights in the invention. --.

Signed and Sealed this

Twenty-second Day of November, 2005

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,872,801 B2 | Page 1 of 1 |
| APPLICATION NO. | : 10/042360 | |
| DATED | : March 29, 2005 | |
| INVENTOR(S) | : Ong et al. | |

It is certified that error appears in the above-identified patent and that said Letters Patent is hereby corrected as shown below:

In the Specification

Column 1,
Line 16, insert the following section:
-- STATEMENT REGARDING FEDERALLY SPONSORED RESEARCH OR DEVELOPMENT
This invention was made with United States Government support under Cooperative Agreement No. 70NANB0H3033 awarded by the National Institute of Standards and Technology (NIST). The United States Government has certain rights in the invention. --.

This certificate supersedes the Certificate of Correction issued November 22, 2005.

Signed and Sealed this
Seventeenth Day of September, 2013

Teresa Stanek Rea
*Deputy Director of the United States Patent and Trademark Office*